(12) United States Patent
Kusch et al.

(10) Patent No.: US 12,289,872 B2
(45) Date of Patent: Apr. 29, 2025

(54) CHIP ON CERAMICS POWER MODULE WITH LOW INDUCTANCE AND COMPACT ARRANGEMENT

(71) Applicants: VOLKSWAGEN AKTIENGESELLSCHAFT, Wolfsburg (DE); University of Tennessee Research Foundation, Knoxville, TN (US)

(72) Inventors: Rüdiger Kusch, Braunschweig (DE); Yue Sun, Knoxville, TN (US); Hua Bai, Knoxville, TN (US); Hendrik Gerth, Lehrte (DE)

(73) Assignees: VOLKSWAGEN AKTIENGESELLSCHAFT, Wolfsburg (DE); University of Tennessee Research Foundation, Knoxville, TN (US)

( * ) Notice: Subject to any disclaimer, the term of this patent is extended or adjusted under 35 U.S.C. 154(b) by 407 days.

(21) Appl. No.: 17/863,953

(22) Filed: Jul. 13, 2022

(65) Prior Publication Data

US 2024/0023293 A1    Jan. 18, 2024

(51) Int. Cl.
*H05K 7/20*        (2006.01)
*H01L 23/473*      (2006.01)

(52) U.S. Cl.
CPC ....... *H05K 7/20927* (2013.01); *H01L 23/473* (2013.01); *H05K 7/20272* (2013.01)

(58) Field of Classification Search
CPC . H01L 23/473; H01L 25/072; H01L 2924/00; H01L 2924/00014; H01L 23/3121; H01L 21/4882; H01L 2224/48227; H01L 23/34; H01L 23/3672; H01L 23/367; H01L 2224/48247;
(Continued)

(56) References Cited

U.S. PATENT DOCUMENTS 5,436,501 A * 7/1995 Ikeda ................. H01L 23/4735
                                                        165/80.4
5,666,269 A * 9/1997 Romero .................... F28F 3/12
                                                        257/E23.098
(Continued)

FOREIGN PATENT DOCUMENTS

EP          2747133 A2    6/2014

*Primary Examiner* — Michael A Matey
(74) *Attorney, Agent, or Firm* — Shield Intellectual Property PC; Zhichong Gu (57) ABSTRACT

Approaches, techniques, and mechanisms are disclosed for packaging electric power components. A power module comprises: a three-dimensional (3D) cooling structure that has a plurality of planar sides; a first set of mountable power components that are mounted on a first planar side in the plurality of planar sides of the 3D cooling structure; a second set of mountable power components that are mounted on a second planar side in the plurality of planar sides of the 3D cooling structure. The second planar side represents an opposing side, of the 3D cooling structure, to the first planar side. The 3D cooling structure includes an interior space containing one or more cooling channels in which cooling fluid is to flow. The interior space of the 3D cooling structure is spatially surrounded by other planar sides in the plurality of planar sides in combination with the first and second planar sides.

19 Claims, 7 Drawing Sheets

(58) Field of Classification Search
CPC .......... H01L 2224/06181; H01L 23/00; H01L 23/5389; H01L 2225/1094; H05K 1/181; H05K 5/0217; H05K 7/2089; H05K 7/20927; H05K 7/20272; H05K 1/144; H05K 1/145; H02M 7/5387
See application file for complete search history.

(56) References Cited

U.S. PATENT DOCUMENTS

| | | | |
|---|---|---|---|
| 7,786,486 B2 | 8/2010 | Casey et al. | |
| 7,834,448 B2 | 11/2010 | Gerbsch | |
| 9,220,182 B2* | 12/2015 | Otsuka | H05K 7/20236 |
| 10,874,037 B1* | 12/2020 | Gupta | B60K 6/387 |
| 11,101,193 B2* | 8/2021 | Joshi | H05K 7/20927 |
| 11,864,357 B2* | 1/2024 | Zhou | H05K 7/20254 |
| 2006/0284308 A1* | 12/2006 | Harada | H01L 23/473 |
| | | | 257/729 |
| 2009/0057882 A1* | 3/2009 | Gerbsch | H01L 23/473 |
| | | | 257/E23.098 |
| 2009/0219694 A1* | 9/2009 | Marz | H01L 23/473 |
| | | | 361/699 |
| 2013/0050947 A1* | 2/2013 | Kadoguchi | H01L 23/4334 |
| | | | 29/592.1 |
| 2013/0077255 A1* | 3/2013 | Abe | H05K 7/209 |
| | | | 361/716 |
| 2013/0134572 A1* | 5/2013 | Lenniger | H01L 23/367 |
| | | | 438/122 |
| 2013/0285234 A1* | 10/2013 | Uhlemann | H01L 23/473 |
| | | | 257/782 |
| 2014/0158324 A1* | 6/2014 | Tochiyama | H01L 23/473 |
| | | | 165/67 |
| 2016/0260654 A1* | 9/2016 | Yoo | H01L 23/08 |
| 2016/0315033 A1* | 10/2016 | Otremba | H01L 23/49524 |
| 2017/0033704 A1* | 2/2017 | Lei | H02M 1/00 |
| 2017/0223875 A1* | 8/2017 | Tsuyuno | H01L 25/18 |
| 2018/0040538 A1* | 2/2018 | Schuderer | H01L 29/1608 |
| 2018/0090441 A1* | 3/2018 | Traub | H01L 29/00 |
| 2019/0222018 A1* | 7/2019 | Reiter | H01L 23/473 |
| 2019/0335608 A1* | 10/2019 | Song | H05K 7/20854 |
| 2020/0152547 A1* | 5/2020 | Alawieh | F28D 15/04 |
| 2020/0180026 A1* | 6/2020 | Dariavach | B33Y 70/00 |
| 2020/0187385 A1* | 6/2020 | Olesen | H01L 23/473 |
| 2020/0357717 A1* | 11/2020 | Maier | H01L 25/115 |
| 2021/0068310 A1* | 3/2021 | Hain | H05K 7/209 |
| 2021/0094424 A1* | 4/2021 | Sperber | B60L 15/007 |
| 2022/0093486 A1* | 3/2022 | Reiter | H01L 23/49811 |
| 2023/0014410 A1* | 1/2023 | Kotb | G01K 7/01 |
| 2023/0268332 A1* | 8/2023 | Tang | H01L 23/427 |
| | | | 257/675 |
| 2023/0309274 A1* | 9/2023 | Pouilly | H05K 7/2089 |

* cited by examiner

CHIP ON CERAMICS POWER MODULE WITH LOW INDUCTANCE AND COMPACT ARRANGEMENT

TECHNICAL FIELD

Embodiments relate generally to electric component packaging, and, more specifically, to electric power component packaging.

BACKGROUND

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

Electric power components, including but not limited to integrated circuits for power applications in connection with vehicle systems or non-vehicle systems, are susceptible to generate excessive heat and high temperature during operation. A variety of cooling or heat removal mechanisms may be implemented based in part or in whole on thermal convection, conduction and/or radiation to cool power components.

For example, electric power components can be cooled through distributing bare die ICs for power applications on a cooling plate. However, relatively large space or area would be needed to distribute these ICs on the cooling plate. Such large space or area may or may not be available in all power application scenarios. Therefore, it would be desirable to fully utilize available space for accommodating the electric power components.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION

In the following description, for the purposes of explanation, numerous specific details are set forth in order to provide a thorough understanding of the present disclosure. It will be apparent, however, that the present disclosure may be practiced without these specific details. In other instances, well-known structures and devices are shown in block diagram form in order to avoid unnecessarily obscuring the present disclosure.

Embodiments are described herein according to the following outline:

1.0. General Overview
2.0. Structural Overview
  2.1. First Example Arrangement
  2.2. Second Example Arrangement
  2.3. Third Example Arrangement
  2.4. Fourth Example Arrangement
  2.5. Incorporating Decoupling Capacitors
  2.6. Double Row Arrangements
3.0. Example Embodiments
4.0. Extensions and Alternatives

1.0. General Overview

Under techniques as described herein, novel and/or existing thermally conductive materials may be utilized to construct cooling structures. These cooling structures can be used to implement a relatively efficient thermal (e.g., conductive, convective, etc.) chain that removes or dissipates a relatively large amount of heat generated during operation by electric power components in an electric power package as described herein.

Example electric power components in an electric power package as described herein, may, but are not necessarily limited to only, integrated circuits (ICs) for power applications. Example thermally conductive materials used to construct a cooling structure as described herein may include, but are not necessarily limited to only, ceramic and/or non-ceramic materials with relatively high thermal conductance (as used herein, thermal conductance and thermal conductivity may be used interchangeably) and/or relatively high electric insulation (or resistance), etc.

At least some of external surfaces (or portions therein) of a cooling structure as described herein may be disposed with a layer of thermally conductive and electrically conductive materials such as direct bond copper (DBC) and/or other types of thermally conductive and electrically conductive materials other than copper or DBC to form DC and AC terminal leads to connect the electric power package with a DC power source and/or an AC load. This layer of thermally conductive and electrically conductive materials may be referred to as copper trace for simplicity.

In addition to supporting or providing a relatively high cooling performance, the cooling structure and the copper trace thereon may be specifically designed to fully exploit, or make efficient use of, available mountable (e.g., external, etc.) surfaces or areas of the cooling structure for mounting the electric power components. Under techniques as described herein, spatial sizes or dimensions of the cooling structure and/or the overall size or footprint of the electric power package can be reduced or minimized, and the total amount of the novel or available thermally conductive materials—which may be relatively expensive—used to construct the cooling structure can likewise be reduced or minimized.

In some embodiments, bare die ICs for power applications may be mounted on and electrically connected with multiple (e.g., external, planar, etc.) sides of the cooling structure such as the top and bottom sides or surfaces. These ICs may be provided without printed circuit boards or PCBs but with mounting pads to be bonded with or mounted on the copper trace. The cooling structure may host one or more cooling channels that are disposed near or around the bare dies to extract or dissipate heat generated during operation by these power ICs. Some or all of the cooling channels may be implemented with substrates of thermally conductive ceramic or non-ceramic material(s).

Multi-side cooling such as double sided cooling may be implemented through feeding or arranging the one or more cooling channels spatially around the bare dies in three spatial dimensions to cool the bare die ICs, in order to support a relatively high power density design of the electric power package and relatively efficient heat removal or dissipation through the cooling channels.

For example, the electric power components or bare dies can be positioned, arranged or spatially distributed along a single dimension or multiple dimensions. For example, half of the electric power components or bare dies in the electric power package may be positioned, arranged or spatially distributed in a single row or double rows on a single planar surface or substrate such as each of the top and bottom sides of the cooling structure.

Additionally, optionally or alternatively, circumferential (copper) trace routing such as electrically conductive loops or rings may be fabricated using a specific spatial pattern of the copper trace. Such trace routing or copper trace pattern may spatially span across or over multi-dimensional portions of four out of the six different sides or planar surfaces of a rectangular shape and involve routing in multiple spatial dimensions in the three-dimensional physical space.

The circumferential trace routing and spatial distributions of power components or bare dies can be used, for example in a complete half bridge configuration, to minimize thermal resistance, to cancel magnetic flux, and to minimize parasitic inductance associated with the electric power components. For example, an electrically conductive loop or ring as described herein may be used to create a counterbalance electric current loop, for example during commutation in a device in which a directional or phase reversal or a magnitude change of electric current takes place. Magnetic fluxes generated by electric current flowing in the loop or rings can be used to cancel magnetic fluxes generated by electric current flowing in the main power loop, thereby reducing or minimizing parasitic loop inductance during commutation.

Some or all terminal leads such as DC terminal leads of the electric power package may be specifically shaped or positioned to incorporate decoupling capacitors as a part of the electric power package and to place these decoupling capacitors relatively close to the bar dies/switches of the electric power components (e.g., ripple voltage/current source, etc.) in a relatively compact design. This allows further improvement in the parasitic properties of the electric power package as well as realization of a split capacitor design that separates the decoupling capacitors from DC link capacitors.

In this split capacitor design, DC link capacitors may be external to the electric power package, whereas decoupling capacitors may be integrated and packaged as a part of the electric power package. Capacitances of the DC link capacitors can be minimized, while bulky spatial sizes can be avoided or significantly reduced for the DC link capacitors.

In some operational scenarios, the electric power package (or device) may be used inside a power core of an in-vehicle inverter that supplies electric power (e.g., variable AC voltages, fixed AC voltages, 395 volts . . . , 850 volts, different power classes, etc.) for vehicle propulsion or non-propulsion operations.

Example approaches, techniques, and mechanisms are disclosed for packaging electric power components. According to one embodiment, a power module comprises: a three-dimensional (3D) cooling structure that has a plurality of planar sides; a first set of mountable power components that are mounted on (and electrically connected with) a first planar side in the plurality of planar sides of the 3D cooling structure; a second set of mountable power components that are mounted on (and electrically connected with) a second planar side in the plurality of planar sides of the 3D cooling structure. The second planar side represents an opposing side, of the 3D cooling structure, to the first planar side. The 3D cooling structure includes a (e.g., 3D, etc.) interior space containing one or more cooling channels in which cooling fluid is to flow. The interior space of the 3D cooling structure is spatially surrounded by other planar sides in the plurality of planar sides in combination with the first and second planar sides. The inner cooling structure is a trade-off constrained by the amount of power to be cooled, wanted or unwanted turbulence regions, maximum allowable pressure drop and particle size in case of an in automotive typical non-ideal coolant. Such an approach allows this design trade-off to be optimized to its best.

2.0. Structural Overview

Figure 1:
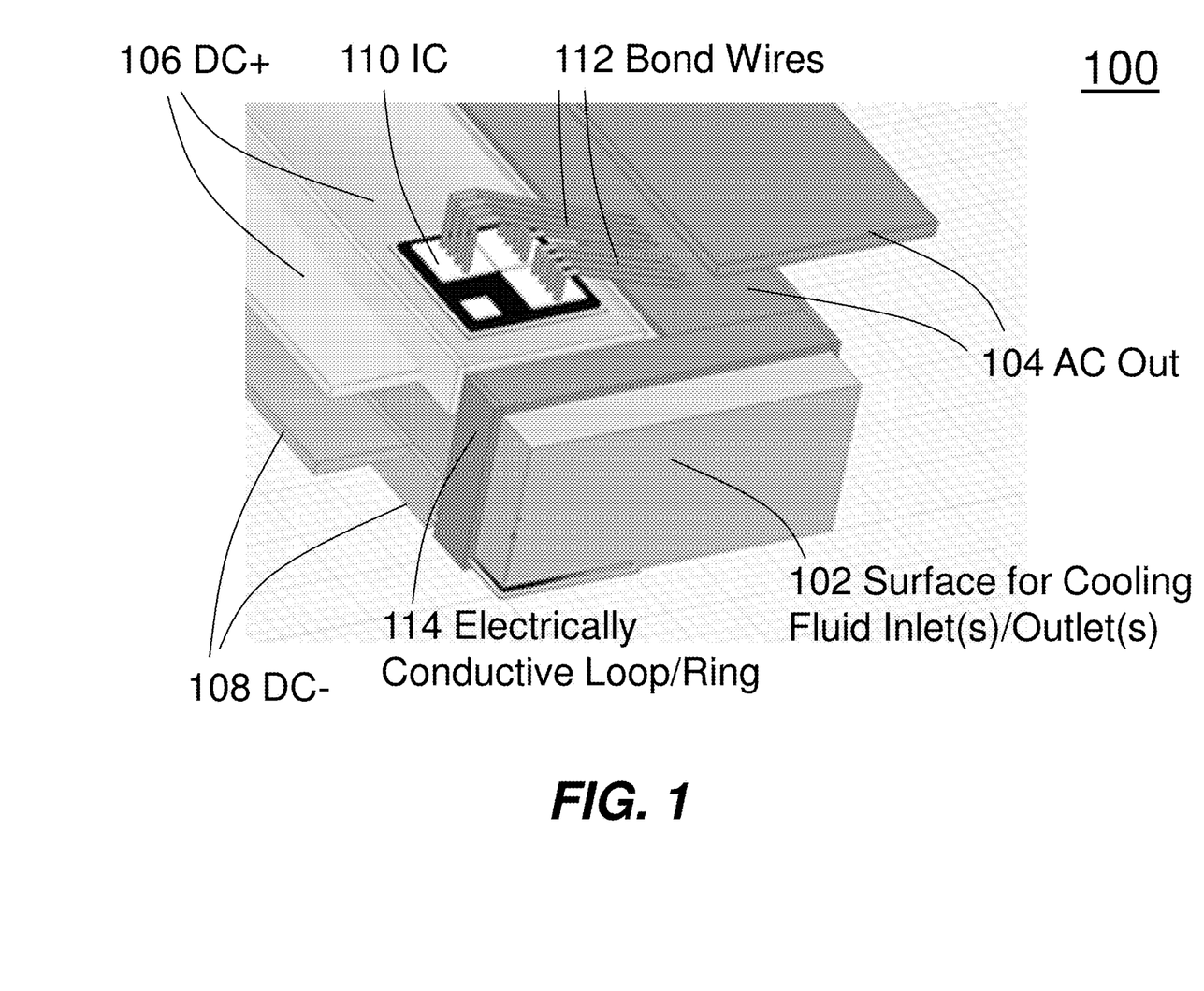
FIG. 1 illustrates an example portion of an electric power package or module.

FIG. 1 illustrates a perspective view of an example portion of an electric power package 100. By way of example but not limitation, the electric power package 100 represents a power inverter (e.g., a DC/AC inverter, a transformerless inverter, a switch based inverter, etc.) that uses integrated circuits (ICs) to selectively switch among DC positive, negative and/or zero voltages values and/or to perform waveform and/or frequency filtering for the purpose of approximating an AC output of specific fixed and/or variable frequencies—e.g., uses ICs or bare die to switch on and off to perform change DC voltage and current to AC voltage and current with variable or fixed magnitude and frequency. The power inverter may, but is not necessarily limited to only, be used for vehicle propulsion, auxiliary vehicle functions implemented with a vehicle, non-vehicle operations, etc.

As shown, the electric power package 100 includes a pair of DC positive (DC+) and DC negative (DC−) terminal leads 106 and 108, which can be electrically connected (e.g., through removable electric wiring, through external electric wiring, etc.) with positive and negative electrodes (or bus or terminals), respectively, of a DC power source—which may also be referred to as a DC power supply (not shown). Example DC power sources as described herein may include, without limitation, one or more of: individual batteries, battery banks, battery modules each of which includes one or more batteries, battery packs each of which includes one or more battery modules, DC power generators, photovoltaic DC power sources, etc.

The electric power package 100 includes a plurality of power components—one of which may represent an IC 110 of FIG. 1—that operate in parallel and converts an input DC voltage provided by the DC power source through the DC+ and DC− terminal leads 106 and 108 into an output AC voltage as the AC output. The output AC voltage may be of frequencies as regulated, supported or controlled through (e.g., turning on or off, duty cycles of, etc.) the power components (e.g., one of which is the IC 110, etc.) in the electric power package 100. The output AC voltage may be of magnitudes as regulated, supported or controlled through (e.g., turning on or off, duty cycles of, etc.) the power components (e.g., one of which is the IC 110, etc.) in the electric power package 100. The output AC voltage may be outputted from the electric power package 100 in part through an AC Out terminal lead 104. The DC+, DC− and AC Out terminal leads 106, 108 and 104 may simply be referred to as DC+ 106, DC− 108 and AC Out 104, respectively.

Example power components or ICs (e.g., 110, etc.) as described herein may include, but are not necessarily limited to only, one or more of: gallium nitride high electron mobility transistor (GaN HEMT), Silicon Carbide (SiC) MOSFETs, metal oxide semiconductor field effect transistors (MOSFETs), insulated-gate bipolar transistors (IGBTs), bipolar junction transistors (BJTs), other types of transistors, diodes, low-pass filters, capacitors, inductors, resistors, etc.

The plurality of power components in the electric power package 100 may be deployed or mounted on and electrically connected with multiple sides (e.g., top and bottom planar sides, etc.) of a cooling structure, which may, but is not limited to, have exterior surfaces generally conforming to a three-dimensional (3D) rectangular shape. The cooling structure includes—or encloses substantially except for cooling fluid inlet(s) and/or outlet(s)—one or more cooling channels. Each of the cooling channels may have a corresponding cooling fluid inlet on a planar surface (e.g., 102 of FIG. 1, etc.) of the cooling structure and/or a corresponding cooling fluid outlet on the same or a different planar surface of the cooling structure. The cooling structure with its cooling channels and cooling fluid inlets/outlets therein or thereon can be made in part or in whole—for example using etching and laminating process(es), a casting process, a molding process or another available ceramic or non-ceramic fabrication, shaping or forming process—with (e.g., novel, available, relatively efficient, electrically insulating, etc.) thermally conductive materials such as thermally conductive and electrically insulating ceramic materials.

The cooling structure may be of a three-dimensional (3D) regular or irregular spatial shape enclosed—for example, substantially except for cooling fluid inlets/outlets—by a plurality of exterior surfaces. For the purpose of illustration only, the cooling structure represents a 3D rectangular shape enclosed by six planar surfaces such as top, bottom, front, back, left and right sides. The front side, a part of the top side and a part of left side of the cooling structure are illustrated in FIG. 1.

In some operational scenarios, some or all of the cooling fluid inlets and/or outlets of the cooling channels may be (e.g., entirely, etc.) placed on or through the (e.g., single, etc.) planar surface 102 or the front side of the cooling structure. Additionally, optionally or alternatively, some or all of the cooling fluid inlets and/or outlets of the cooling channels may be placed on or through another planar surface (not shown) of the cooling structure such as a planar surface on the opposing side to the planar surface 102 or the back side of the cooling structure.

Some or all of the remaining planar surfaces—other than the planar surface(s) used for placing cooling fluid inlets/outlets—in the plurality of planar surfaces enclosing the cooling structure may be at least partially surrounded, deposited, or otherwise disposed, with a layer of electrically (and thermally) conductive material(s). The layer of electrically conductive material(s) on these planar surfaces may form a specific spatial pattern, for example through a printed circuit board (PCB) fabrication process employing additive, subtractive (e.g., etching, etc.) or semi-additive PCB fabrication techniques. Additionally, optionally or alternatively, direct copper bonded technologies can be used to fabricate a specific spatial pattern of copper trace(s) using additive manufacturing technologies. The layer can also be machined to generate or create a specific (e.g., desired, designed, etc.) spatial pattern of copper trace(s). For simplicity, the layer of electrically conductive material(s) may simply and/or alternatively be referred to as copper trace in much of the discussions herein. It should be noted, however, that in various embodiments, such a layer may or may not be composed of copper materials (e.g., direct bonded copper or DBC, etc.). For example, in other example embodiments, the layer may instead be additionally, optionally or alternatively composed of aluminum, other metallic material(s), alloy(s), other trace composed electrically conductive material(s), etc.

The cooling structure may comprise structure elements such as ceramic cooling plates that form an inner structure including but not limited to the cooling channels—which are spatial voids used to take the cooling fluid inside the cooling structure. The cooling fluid inside the cooling structure or the cooling channels therein may be bounded by the inner structure and used to extract, transfer, dissipate, or remove heat generated from the power components during operation, for example through turbulent or non-turbulent cooling fluid flows through the cooling channels. Example inner structures as described herein may include, but are not necessarily limited to only, one or more of: cooling fluid inlets, cooling fluid outlets, inner distribution structures, pin structures, pin fins, flow shields used to interrupt fluid flows to enforce turbulences, etc.

Each of the DC+ 106, DC− 108 and AC Out 104 may be formed at least in part by respective portions of the copper trace on the exterior surfaces of the cooling structure. The copper trace may be specifically patterned on the exterior surfaces of the cooling structure to provide electric insulation—except through the power components such as the IC 110 or bond wires leading from the power components such as 112 of FIG. 1—between any two of the DC+ 106, DC− 108 and AC Out 104.

ICs for power applications (or power semiconductors) may be packaged in bare dies. These ICs or bare dies can be mounted onto (and electrically connected with) the copper trace of the cooling structure in parallel in a half bridge configuration with relatively low thermal resistances, relatively low electric resistances and relatively low parasitic inductances. A bare die that includes a power component as described herein may be mounted, for example using a pressure sintering process, a die attachment technology including but not limited to silver sintering, a soldering process, an adhesive process, etc., onto the copper trace (e.g., DBC, etc.) on the first and second planar sides of the cooling structure of the electric power package 100.

For example, one half (e.g., the IC 110, etc.) of the plurality of power components in the electric power package 100 may be mounted onto (and electrically connected with) the copper trace located on a first planar side such as a top planar side of the cooling structure, whereas the other half (not shown) of the plurality of power components in the electric power package 100 may be mounted onto (and electrically connected with) the copper trace located on a second planar side—different from the first planar side—such as a bottom planar side (not shown) of the cooling structure.

Each power component (e.g., 110, etc.) in the one half of the plurality of power components in the electric power package 100 may be included in a corresponding bare die that is mounted onto (and electrically connected with) a first portion of the copper trace that forms a part of the DC+ 106 located on the top side of the cooling structure of the electric power package 100. As illustrated in FIG. 1, bond wires of the power component on the top side may be mounted or soldered (and electrically connected with) on a second portion of the copper trace that forms a part of the AC Out 104.

In comparison, each power component (not shown in FIG. 1) in the other half of the plurality of power components in the electric power package 100 may be included in a corresponding bare die that is mounted onto (and electrically connected with) the second portion of the copper trace that forms a part of the AC Out 104 located on the bottom side (not shown in FIG. 1) of the cooling structure of the electric power package 100. Bond wires—of the power component or in addition to or separate from the power component—on the bottom side may be mounted or soldered on a third portion of the copper trace that forms a part of the DC− 108.

One or more electrically conductive loops or (complete) rings may be formed, made or fabricated on the exterior surfaces of the cooling structure as a part of the electric power package 100. These electrically conductive loops or rings (e.g., one of which is represented by 114 of FIG. 1, etc.) may be a part of the copper trace—for example located away from other parts of the copper trace on which the power components and the bond wires are mounted. In a non-limiting example, two electrically conductive loops or rings may be provisioned, made or otherwise fabricated on the copper trace at both ends (at or near the front and back sides of the cooling structure) of a contiguous spatial section, of the cooling structure, on which the power components and bond wires are mounted on (and electrically connected with) the copper trace. The width of the copper trace used to form the electrically conductive loops or rings may be specifically designed or selected (e.g., through simulation, through computation model prediction, through empirical studies, etc.) to generate or effectuate optimized or maximized magnetic flux cancellation. Additionally, optionally or alternatively, one or more electrically conductive loops or rings may be provisioned, made or otherwise fabricated on the copper trace at other spatial locations such as located in the interior part of a contiguous spatial section, of the cooling structure, on which the power components and bond wires are mounted on (and electrically connected with) the copper trace.

In some embodiments, some or all of these electrically conductive loops or rings may be electrically insulated from any and all of the DC+ 106, DC− 108 and AC Out 104; the electric insulation from these terminal leads may be effectuated using a specifically selected spatial pattern for the copper trace. In some embodiments, at least one of these electrically conductive loops or rings may be electrically connected with one (e.g., the AC out 104, etc.) of the DC+ 106, DC− 108 and AC Out 104. For example, some or all of the electrically conductive loops or rings are electrically insulated from the DC+ 106 and DC− 108, but are electrically connected with the AC output 104.

The power components in the electric power package 100 can be used to (e.g., relatively frequently, etc.) switch on or off or otherwise vary time durations, directions and magnitudes of electric current flows (e.g., the main current flows for supplying AC power, etc.) through the power components, bond wires and the copper trace during operation. The electrically conductive loops or rings (which may or may not form a closed path) themselves form or represent (e.g., auxiliary, not the main current flows for supplying AC power, etc.) current paths, which may be implemented or arranged, for example, using specific spatial pattern of the copper traces surrounding the cooling structure. Electric current flow direction(s) in the current paths formed with the electrically conductive loops or rings can be reversed with respect to the (main) electric current paths of the main electric currents that supply AC power. Hence, the generated magnetic fluxes by the main electric currents and the electric currents flowing in the loops/rings cancel each other. The induced electric currents flowing in the electrically conductive loops or rings generate secondary magnetic fluxes that can be used to cancel or substantially reduce the magnetic fluxes initially generated from the electric current flows through the power components, bond wires and the copper trace during operation.

As noted, the electric power package 100 may be electrically connected with the positive and negative electrodes (or terminals or bus) of the DC power source or supply through the DC+ and DC− 106 and 108, respectively. In addition, the electric power package 100) may be electrically connected with an AC load at least in part through the AC Out 104. In some operational scenarios, some or all of the DC+, DC− and AC Out (terminal leads) 106, 108 and 104 may be of spatial shapes that include respective extensions or protruding portions. In an example, these extensions or protruding portions in the terminal leads may be formed as a part of the cooling structure without additional mounting operations. In another example, these extensions or protruding portions in the terminal leads may be separately made and subsequently mounted, for example through soldering, sintering and/or adhesion, onto the copper trace of the cooling structure to become a part of the electric power package 100.

2.1. First Example Arrangement

Figure 2:
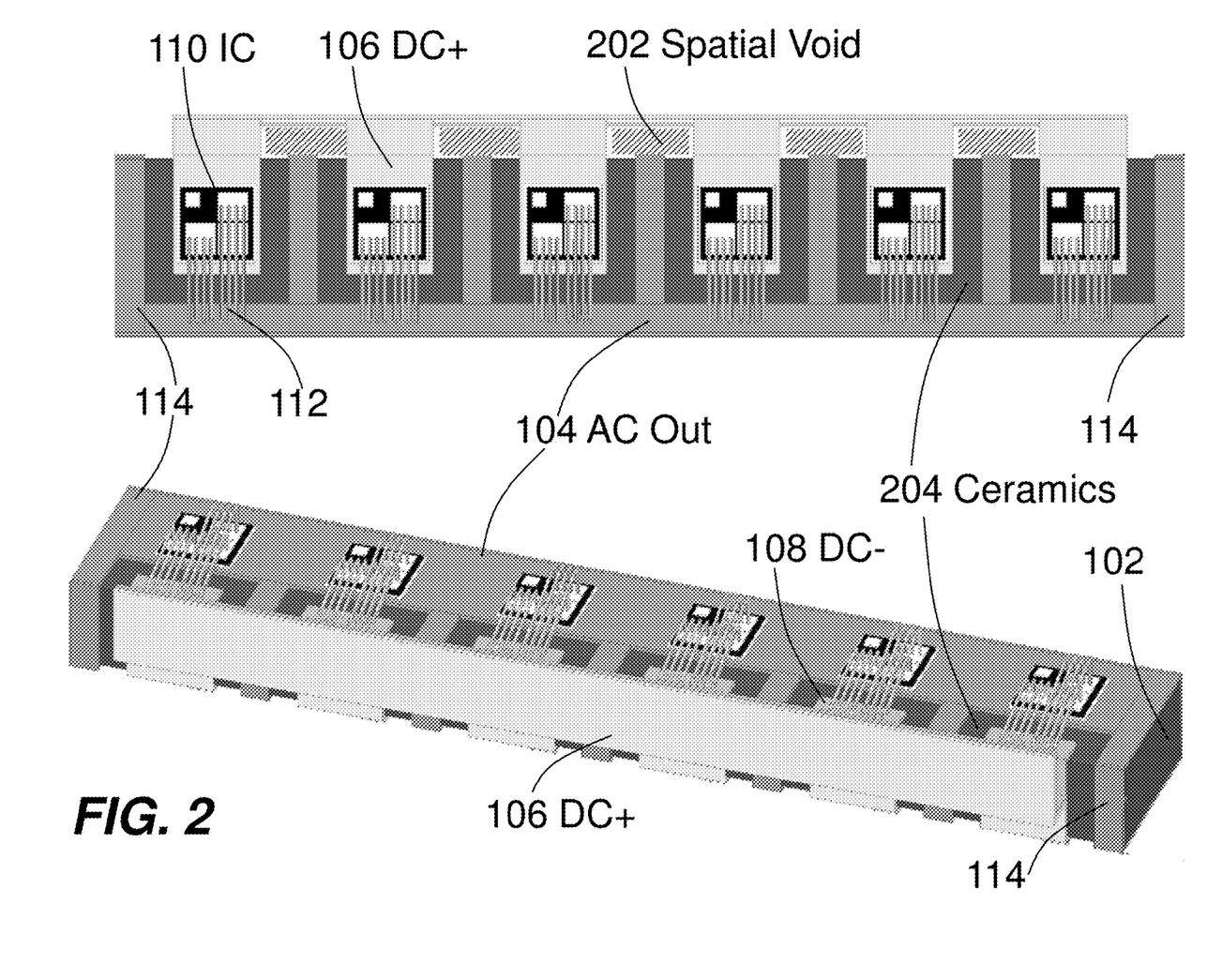
FIG. 2 through FIG. 5 illustrate example arrangements of electric power packages or modules.

FIG. 2 illustrates an example electric power package (e.g., 100 of FIG. 1, etc.) having a plurality of power components mounted on and electrically connected with copper trace of a cooling structure of the electric power package in a first example arrangement. By way of example but not limitation, the total number of the mounted power components is twelve (12).

Six of the power components are mounted along a single spatial direction on a first contiguous copper trace portion (e.g., the DC+ 106, etc.) on the top side of a cooling structure of the electric power package as illustrated in the upper portion of FIG. 2. Bond wires from these six power components are mounted along the same spatial direction on a second contiguous copper trace portion (e.g., AC Out 104, etc.).

In comparison, six others of the power components are mounted along a single spatial direction on the second contiguous copper trace portion (AC Out 104 in the present example) on the bottom side of the cooling structure of the electric power package as illustrated in the lower portion of FIG. 2. Bond wires from these other six power components are mounted along the same spatial direction on a third contiguous copper trace portion (e.g., DC− 108, etc.).

For the purpose of illustration only, the cooling structure is of a 3D rectangular shape with six (exterior) planar surfaces and constructed with thermally conductive and electrically insulating substrate materials such as thermally conductive ceramics materials 204 (dark gray or black). In an interior region of the cooling structure, the ceramics materials 204 or ceramics plates form one or more cooling channels. Each such channel may have a corresponding cooling fluid inlet on a planar surface (e.g., 102, etc.) of the cooling structure and/or a corresponding cooling fluid outlet on the same or a different planar surface of the cooling structure. The planar surface(s) on which the cooling fluid inlet(s) or outlet(s) may be absent of electrically conductive materials with the substrate materials—used to construct the cooling structure—exposed.

A layer of electrically (and thermally) conductive material(s) such as direct bond copper (DBC) at least partially encode the cooling structure in a specific spatial pattern on a subset of planar surfaces such as four (4) surfaces among the plurality of (exterior) planar surfaces of the cooling structure. The specific spatial pattern may include a copper trace with interstitial spatial regions or areas, in which the thermally conductive but the electrically insulating substrate materials such as the ceramic materials 204 are exposed but electrically conductive materials such as DBC are absent or removed.

By way of the copper trace and exposed non-electrically conductive substrate materials such as thermally conductive but electrically insulating ceramic substrates formed in this specific spatial pattern with interstitial spatial regions or areas, the DC+ 106, DC− 108 and AC Out 104 are electrically insulated from one another except through the power components (e.g., 110, etc.), bond wires (e.g., 112, etc.), or other attendant electric components such as capacitors. Additionally, optionally or alternatively, spatial voids, air gaps, spatial cavities, empty spaces, etc., such as 202 (illustrated as diagonal hash patterns) of FIG. 2 may be made with the electric power package for the purpose of electrically isolating some or all of the DC+ 106, DC− 108 and AC Out 104 of the electric power package from one another.

As shown in FIG. 2, each pair of neighboring power components among the six power components on each of the top and bottom sides of the cooling structure of the electric power package is separated with the same or substantially the same distance, for example within error tolerances of an applicable component mounting or placement process. The distance separating between neighboring power components may be specifically selected to ensure (e.g., maximum, ceiling, 95% ceiling, etc.) relatively efficient heat removal from the electric power package or each power component therein while in operation.

Two electrically conductive loops or (complete) rings may be formed, made or fabricated on the exterior surfaces of the cooling structure as parts or portions of the copper trace. The electrically conductive loops or rings may, or alternatively may not, be electrically insulated from all other coper trace portions representing the DC+ 106, DC− 108 and AC Out 104.

2.2. Second Example Arrangement

Figure 3:
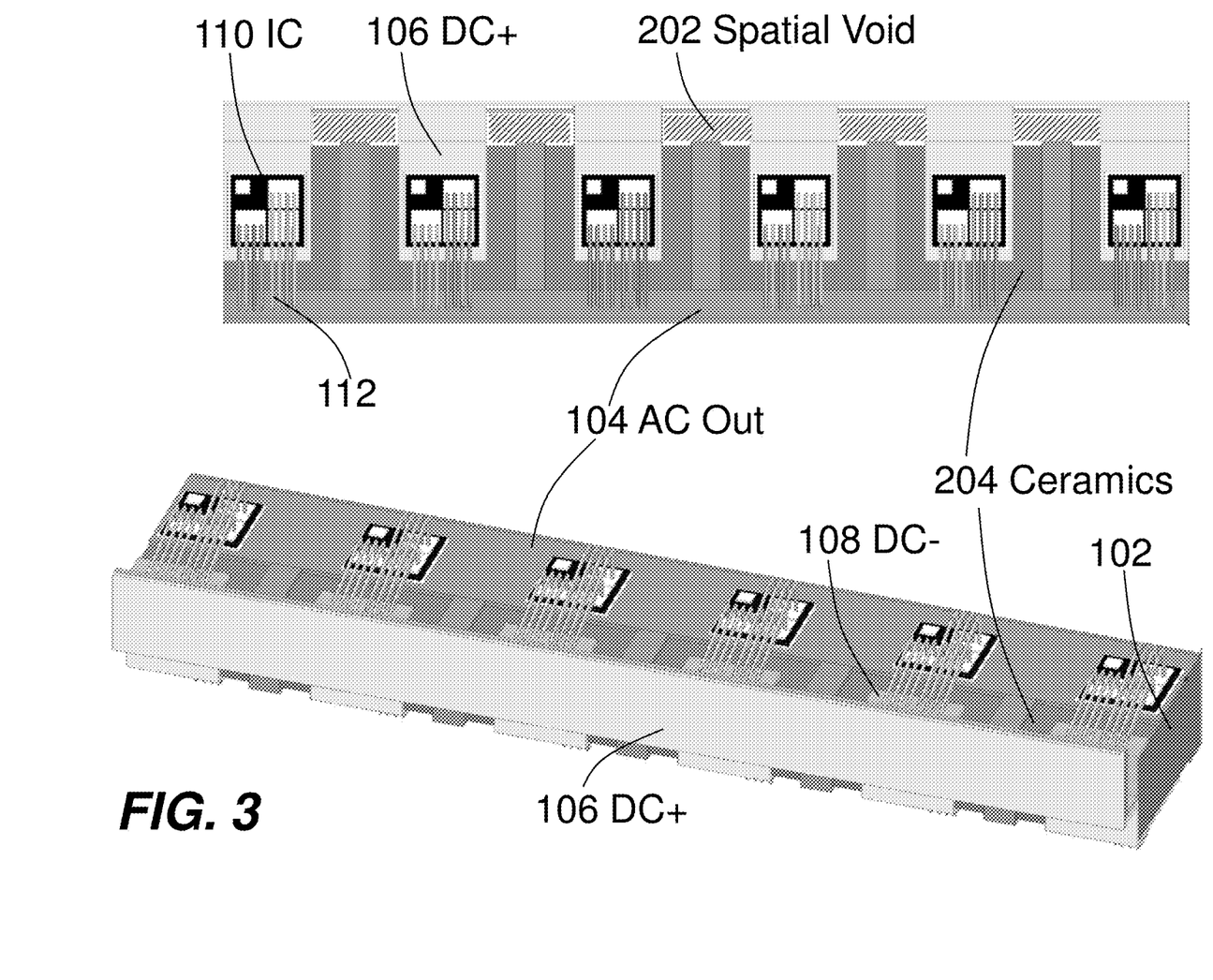

FIG. 3 illustrates an example electric power package (e.g., 100 of FIG. 1, etc.) having a plurality of power components mounted on and electrically connected with copper trace of a cooling structure of the electric power package in a second example arrangement. By way of example but not limitation, the total number of the mounted power components is twelve (12).

The arrangement of the power components as illustrated in FIG. 3 is the same as the arrangement of the power components as illustrated in FIG. 2, with the only difference that the two electrically conductive loops or rings have not been provisioned in the arrangement of FIG. 3. The removal or absence of the electrically conductive loops or rings may be used to reduce the size of a spatial dimension such as between the front and back sides of the cooling structure in the electric power package, thereby reducing the overall size of the footprint of the electric power package, at the expense of a reduced capability of canceling magnetic flux as compared with the arrangement of FIG. 2.

It should be noted that, in this arrangement of FIG. 3, relatively thin electrically conductive loops or rings may still be formed by electrically conductive materials such as contiguous copper trace portions near the front and back sides of the cooling structures. The width of such electrically conductive loops or rings in the second arrangement of FIG. 3 may not be large enough to cancel (e.g., ceiling, maximum, etc.) magnetic flux generated by electric currents flowing through the power components and the bond wires, among other things, during operation as much as compared with the first arrangement of FIG. 2.

It should be noted that one or more electrically conductive loops or rings may still be formed in the interior region between the front and back sides of the cooling structure in the second arrangement of FIG. 3 in the same manner as in the first arrangement of FIG. 2. For example, in both arrangements of FIG. 2 and FIG. 3, an interior electrically conductive loop or ring—for example, of a substantially equal width within a manufacturing error precision—may be placed, made or fabricated on the contiguous copper trace portion representing the AC Out 104 between any two neighboring power components on each of the top or bottom sides of the cooling structure.

2.3. Third Example Arrangement

Figure 4:
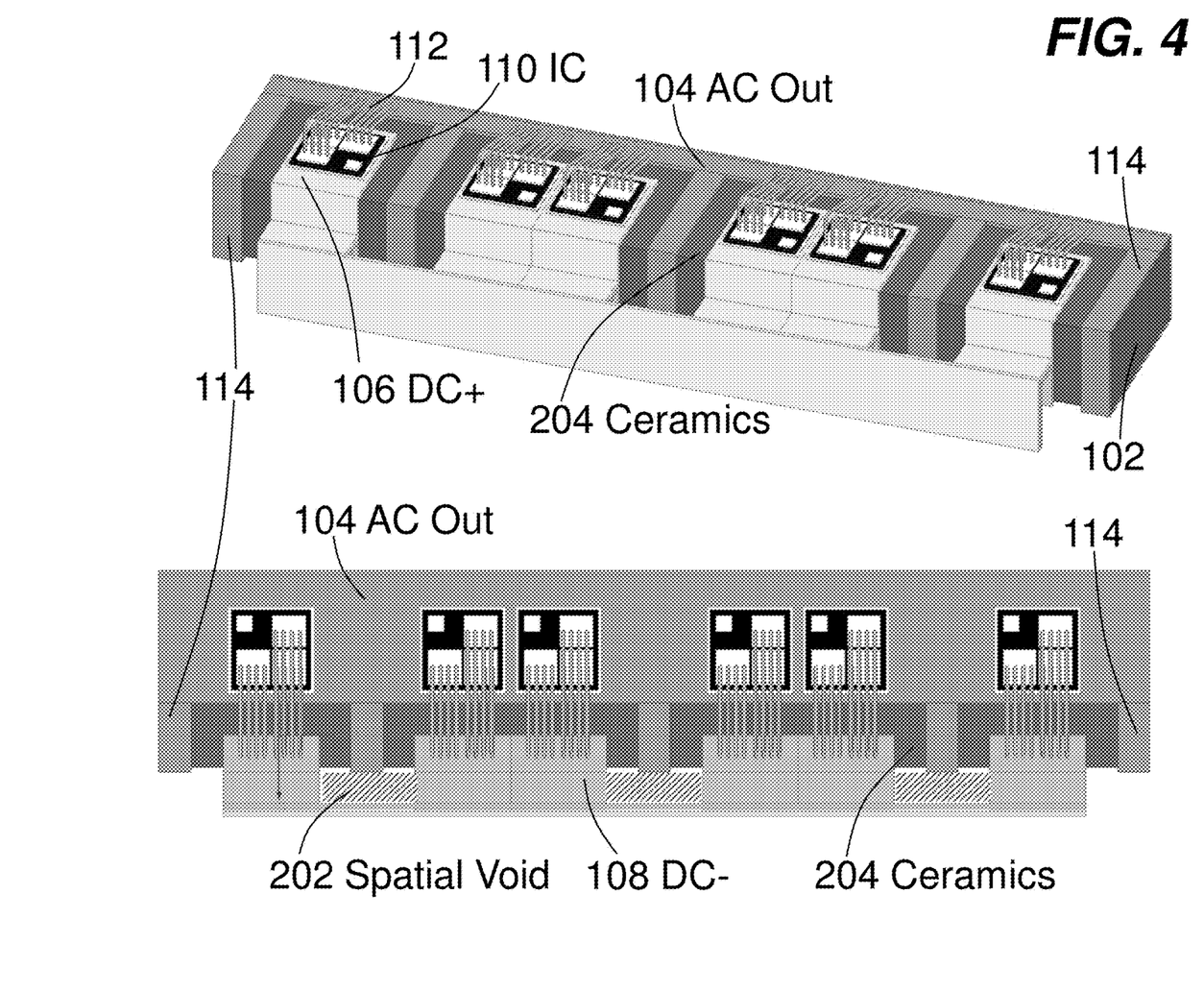

FIG. 4 illustrates an example electric power package (e.g., 100 of FIG. 1, etc.) having a plurality of power components mounted on and electrically connected with copper trace of a cooling structure of the electric power package in a third example arrangement. By way of example but not limitation, the total number of the mounted power components is twelve (12).

Six of the power components are mounted along a single spatial direction on a first contiguous copper trace portion (e.g., the DC+ 106, etc.) on the top side of a cooling structure of the electric power package as illustrated in the upper portion of FIG. 4. Bond wires from these six power components are mounted along the same spatial direction on a second contiguous copper trace portion (e.g., AC Out 104, etc.).

In comparison, six others of the power components are mounted along a single spatial direction on the second contiguous copper trace portion (AC Out 104 in the present example) on the bottom side of the cooling structure of the electric power package as illustrated in the lower portion of FIG. 4. Bond wires from these other six power components are mounted along the same spatial direction on a third contiguous copper trace portion (e.g., DC− 108, etc.).

For the purpose of illustration only, the cooling structure is of a 3D rectangular shape with six (exterior) planar surfaces and constructed with thermally conductive and electrically insulating substrate materials such as thermally conductive ceramics materials 204 (dark gray or black). In an interior region of the cooling structure, the ceramics materials 204 or ceramics plates form one or more cooling channels. Each such channel may have a corresponding cooling fluid inlet on a planar surface (e.g., 102, etc.) of the cooling structure and/or a corresponding cooling fluid outlet on the same or a different planar surface of the cooling structure. The planar surface(s) on which the cooling fluid inlet(s) or outlet(s) may be absent of electrically conductive materials with the substrate materials—used to construct the cooling structure—exposed.

A layer of electrically (and thermally) conductive material(s) such as direct bond copper (DBC) at least partially encode the cooling structure in a specific spatial pattern on a subset of planar surfaces such as four (4) surfaces among the plurality of (exterior) planar surfaces of the cooling structure. The specific spatial pattern may include a copper trace with interstitial spatial regions or areas, in which the thermally conductive but the electrically insulating substrate materials such as the ceramic materials 204 are exposed but electrically conductive materials such as DBC are absent or removed.

By way of the copper trace formed in this specific spatial pattern with interstitial spatial regions or areas, the DC+ 106, DC− 108 and AC Out 104 are electrically insulated from one another except through the power components (e.g., 110, etc.), bond wires (e.g., 112, etc.), or other attendant electric components such as capacitors. Additionally, optionally or alternatively, spatial voids, air gaps, spatial cavities, etc., such as 202 (illustrated as diagonal hash patterns) of FIG. 4 may be made with the electric power package for the purpose of electrically isolating some or all of the DC+ 106, DC− 108 and AC Out 104 of the electric power package from one another.

Two electrically conductive loops or (complete) rings may be formed, made or fabricated on the exterior surfaces of the cooling structure as parts or portions of the copper trace. The electrically conductive loops or rings may, or alternatively may not, be electrically insulated from all other coper trace portions representing the DC+ 106, DC− 108 and AC Out 104.

Some or all of the plurality of power components can be clustered into one or more groups of relatively closely packed neighboring power components. As shown in FIG. 4, four interior power components of the six power components on each of the top and bottom sides of the cooling structure of the electric power package may be grouped into two power component groups, in each of which two neighboring power components are clustered relatively closely spatially. In comparison, each of these spatially clustered groups of power components may be separated from neighboring power component(s) that do not belong to the same group with a relatively large spatial separation. The relatively small intra-group distance and the relatively large inter-group distance may be specifically selected to ensure (e.g., maximum, ceiling, 95% ceiling, etc.) relatively efficient heat removal from the electric power package or each power component therein during operation.

The clustering of some or all of the power components in the electric power package may be used to reduce the size of a spatial dimension such as between the front and back sides of the cooling structure in the electric power package, thereby reducing the overall size of the footprint of the electric power package, at the expense of a possibly reduced capability of extracting or transferring heat generated during operation as compared with the arrangements of FIG. 2 and FIG. 3.

2.4. Fourth Example Arrangement

Figure 5:
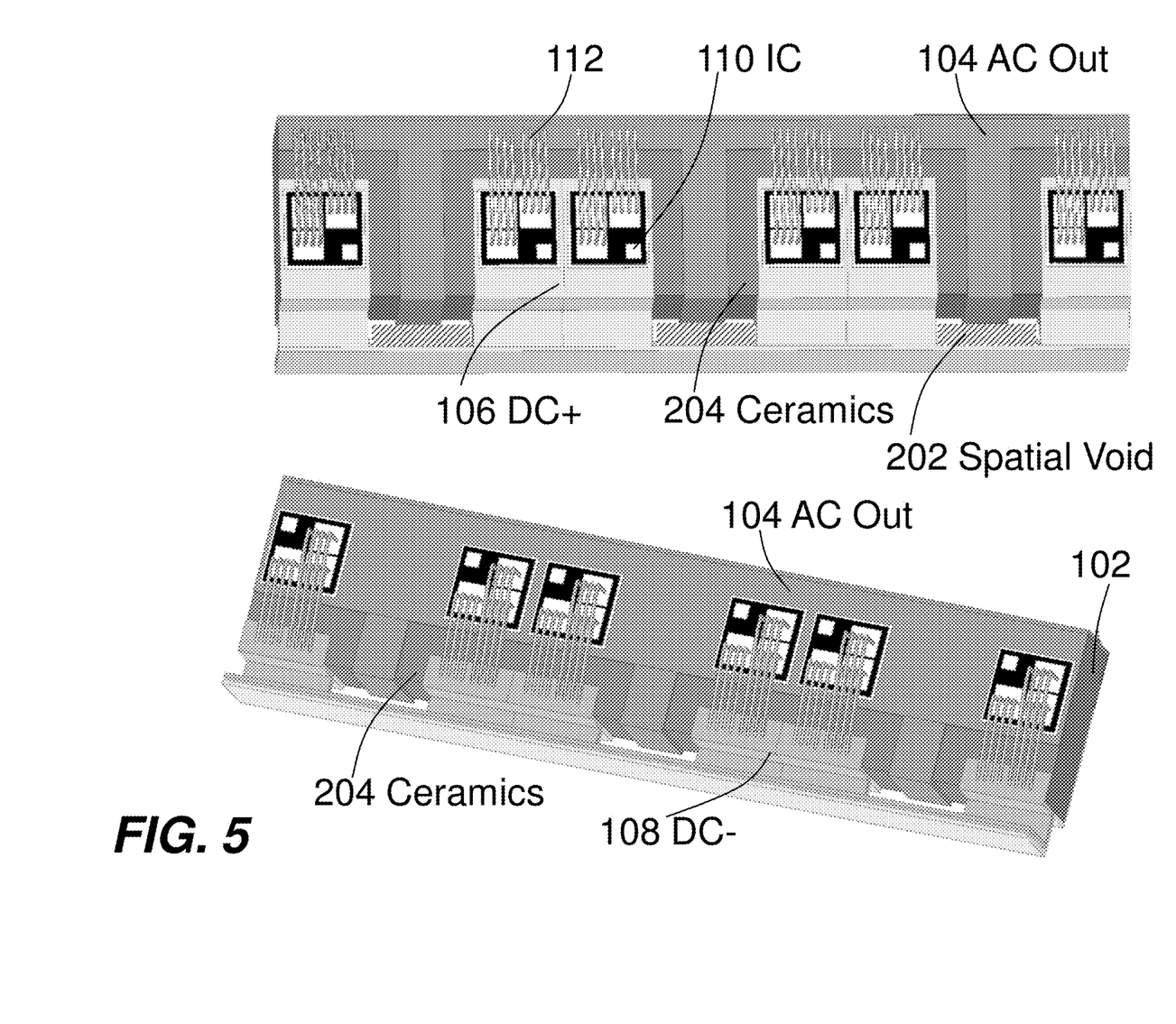

FIG. 5 illustrates an example electric power package (e.g., 100 of FIG. 1, etc.) having a plurality of power components mounted on and electrically connected with copper trace of a cooling structure of the electric power package in a fourth example arrangement. By way of example but not limitation, the total number of the mounted power components is twelve (12).

The arrangement of the power components as illustrated in FIG. 5 is the same as the arrangement of the power components as illustrated in FIG. 4, with the only difference that the two electrically conductive loops or rings have not been provisioned in the arrangement of FIG. 5. The removal or absence of the electrically conductive loops or rings may be used to reduce the size of a spatial dimension such as between the front and back sides of the cooling structure in the electric power package, thereby reducing the overall size of the footprint of the electric power package, at the expense of a reduced capability of canceling magnetic flux as compared with the arrangement of FIG. 5.

It should be noted that, in this arrangement of FIG. 5, relatively thin electrically conductive loops or rings may still be formed by electrically conductive materials such as contiguous copper trace portions near the front and back sides of the cooling structures. The width of such electrically conductive loops or rings in the fourth arrangement of FIG. 5 may not be large enough to cancel (e.g., ceiling, maximum, etc.) magnetic flux generated by electric currents flowing through the power components and the bond wires, among other things, during operation as much as compared with the third arrangement of FIG. 4.

It should be noted that one or more electrically conductive loops or rings may still be formed in the interior region between the front and back sides of the cooling structure in the fourth arrangement of FIG. 5 in the same manner as in the third arrangement of FIG. 4. For example, in both arrangements of FIG. 4 and FIG. 5, an interior electrically conductive loop or ring—for example, of a substantially equal width within a manufacturing error precision—may be placed, made or fabricated on the contiguous copper trace portion representing the AC Out 104 between any two neighboring power components on each of the top or bottom sides of the cooling structure.

2.5. Incorporating Decoupling Capacitors

In some embodiments, additionally, optionally or alternatively, in each of the above discussed arrangements or the like, one or more decoupling capacitors may be incorporated in a relatively compact form as a part of an electric power package. These decoupling capacitors may be placed or mounted at locations adjacent or relatively close to (e.g., DC+ 106, DC− 108, etc.) terminal leads that are to be electrically connected to a DC power source such as a (e.g., ripple, etc.) voltage/current source, thereby improving parasitic performance/property and optionally allowing a split capacitor design that (e.g., physically, spatially, etc.) separates the decoupling capacitors from any DC link capacitors that may be deployed with the electric power package during operation. Switching actions of semiconductor or IC power components may be specifically design to operate in conjunction with the decoupling capacitors. The closer to the power components (e.g., bare dies, power switches, etc.) the decoupling capacitors are, the better the performance of these switching actions. In addition, such split capacitor design enables each type of capacitors to serve its respective specific purpose and to minimize capacitances of the DC link capacitors and hence spatial sizes or footprints of the DC link capacitors. The power module design can be optimized in terms of low parasitic inductance with this design configuration and a split capacitor design.

Figure 6:
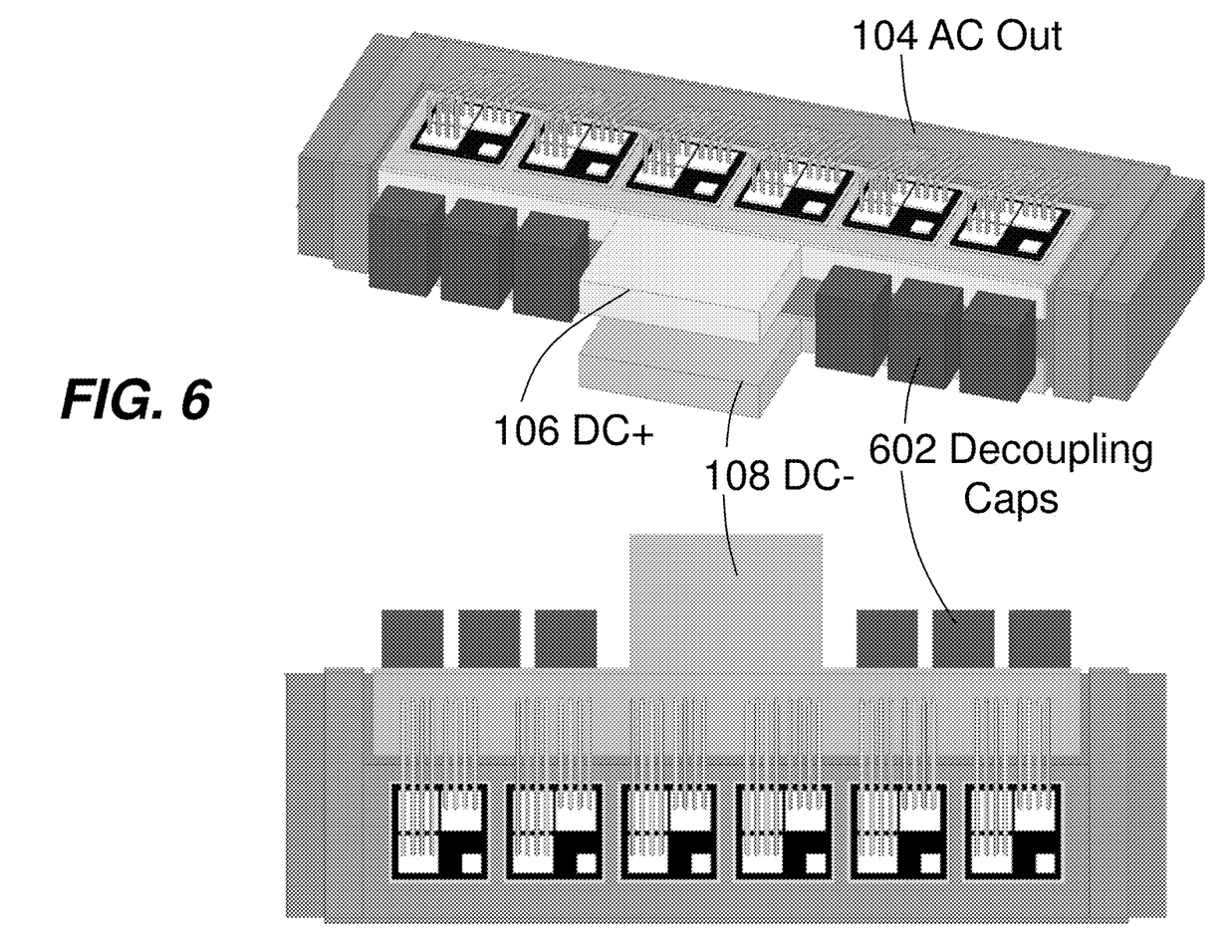
FIG. 6 illustrates an example arrangement of an electric power package that incorporates decoupling capacitors.

FIG. 6 illustrates an example (e.g., modified, etc.) arrangement of an electric power package (e.g., 100 of FIG. 1, etc.) that incorporates one or more decoupling capacitors 602.

As shown, a complete half bridge can be formed within the electric power package in this arrangement that incorporates the decoupling capacitors 602, as in other arrangements. For example, one half of twelve power components included in the electric power package 100 may be mounted on (and electrically connected with) a first copper trace portion representing a DC+ 106 of the electric power package on the top side of a cooling structure of the electric power package as illustrated in the upper portion of FIG. 6, whereas the other half of the twelve power components included in the electric power package 100 may be mounted on (and electrically connected with) a second copper trace portion representing an AC Out 104 of the electric power package on the bottom side of the cooling structure of the electric power package as illustrated in the lower portion of FIG. 6.

Bond wires leading from the one half of twelve power components may be mounted on (and electrically connected with) the second copper trace portion representing the AC Out 104 on the top side of the cooling structure of the electric power package as illustrated in the upper portion of FIG. 6, whereas bond wires leading from the other half of the twelve power components may be mounted on (and electrically connected with) a third copper trace portion representing a DC− 108 of the electric power package on the bottom side of the cooling structure of the electric power package as illustrated in the lower portion of FIG. 6.

The (e.g., DC+ 106, DC− 108, etc.) terminal leads to be electrically connected with the DC power source may be of spatial shapes that allow relatively close spatial placements of the decoupling capacitors 602. By way of example but not limitation, these terminal leads may be made of protruding members or parts extending from a rectangular spatial shape of the cooling structure. In an example, the protruding members or parts can be made or fabricated as a part of the cooling structure—for example, both the rectangular shape and the protruding members or parts can be made or fabricated in a single cooling structure manufacturing or fabrication process. In another example, the protruding members or parts can be soldered or otherwise mounted onto (and electrically connected with), respectively, the first copper trace portion representing the DC+ 106 on the cooling structure and the third copper trace portion representing the DC− 108 on the cooling structure.

As illustrated in FIG. 6, the decoupling capacitors 602 can be mounted on or in between the DC+ 106 and the DC− 108 on a plane that is parallel to a specific side (e.g., left side, etc.) of the cooling structure on which the power components are spatially arranged or mounted on the top and bottom side of the rectangular shape of the cooling structure and on which the cooling fluid inlets/outlets are positioned or located on the front and/or back sides of the rectangular shape of the cooling structure. As a result, the decoupling capacitors are located spatially right at the entry of the DC+ 106 and DC− 108, thereby (e.g., further, additionally, significantly, etc.) reducing parasitic inductance.

Additionally, optionally or alternatively, two electrically conductive loops or rings can be formed or assembled using copper trace portions of the cooling structure at two ends or planar sides of the cooling structures, respectively, for the purpose of canceling magnetic flux while the electric power package is used in operation.

2.6. Double Row Arrangements

In some embodiment, a two-row chip arrangement may be used to place power components with a cooling structure in an electric power package. As in other example (single-row chip) arrangements illustrated herein, in the two-row arrangement, one half of a plurality of power components in the electric power package such as six dies or power components can be mounted on the top side of the cooling structure, whereas the other half of the plurality of power components such as six other dies or power components can be mounted on the bottom side of the cooling structure, thereby forming a complete half bridge.

However, the two-row arrangement is different (e.g., in shape, in dimension, in size, etc.) from other single-row arrangements, in that the power components mounted on each of the top and bottom sides of the cooling structure are arranged in two parallel rows.

At a given time (e.g., any time, in an electric current commutating process, etc.) while the electric power package is in operation, such two-row arrangement can allow or effectuate half of all electric currents flowing through one of the two rows on the top side of the cooling structure and the other half of the all the electric currents flowing through the other of the two rows on the top side of the cooling structure to be in spatially opposite (or mirrored) directions.

In the meantime, such two-row arrangement can also allow or effectuate half of all electric currents flowing through one of the two rows on the bottom side of the cooling structure and the other half of the all the electric currents flowing through the other of the two rows on the bottom side of the cooling structure to be in spatially opposite (or mirrored) directions.

As a result, magnetic flux generated from the electric currents flowing within the electric power package can be naturally canceled, even without needing to provision—but one could still implement if so desired—any electrically conductive loops/rings specifically for such flux cancellation purposes.

Figure 7:
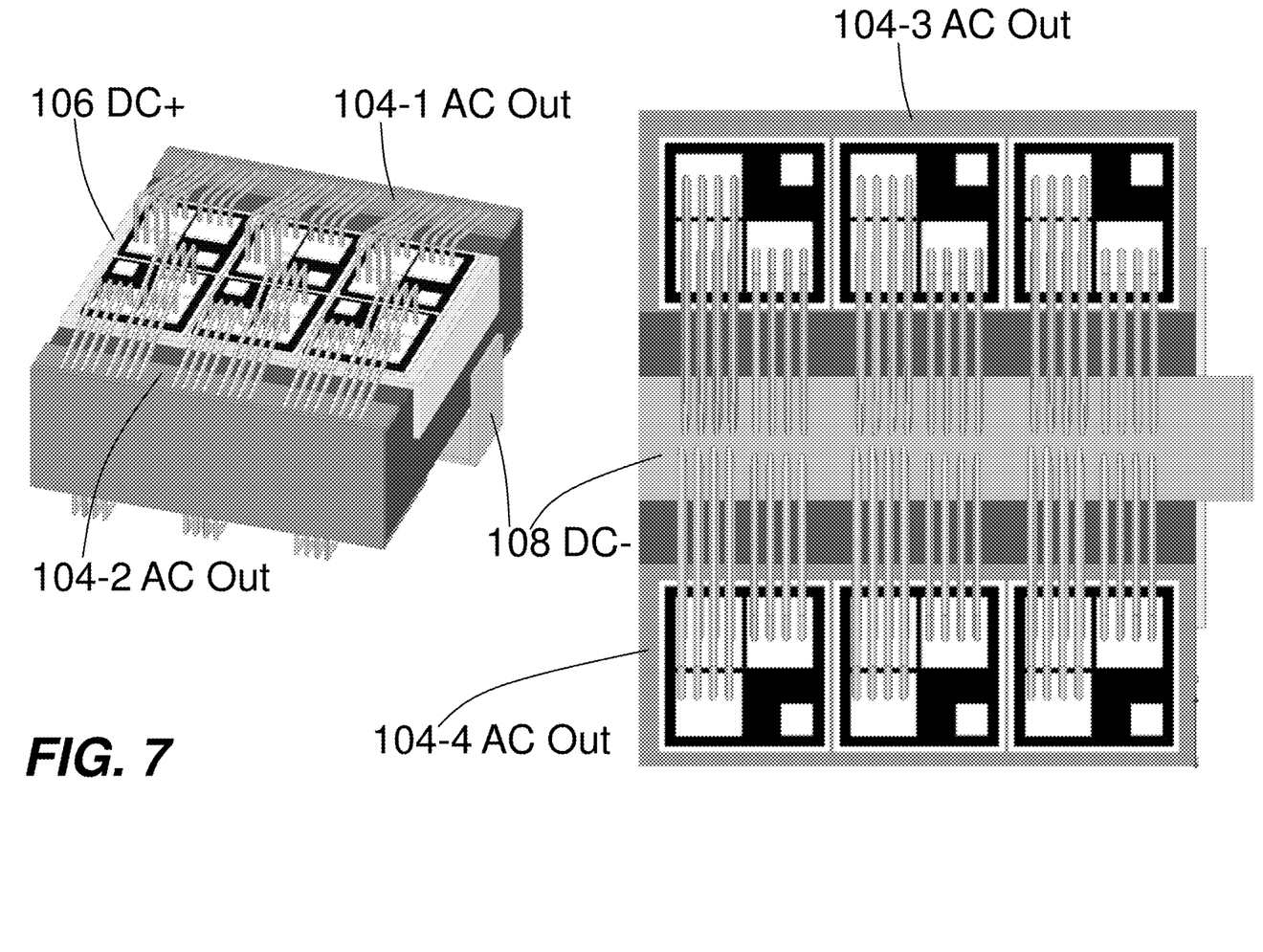
FIG. 7 illustrates an example two-row arrangement of an electric power package.

FIG. 7 illustrates an example two-row arrangement of an electric power package (e.g., 100 of FIG. 1, etc.) having a plurality of power components mounted on or electrically connected with copper trace of a cooling structure in the electric power package.

As illustrated in the left portion of FIG. 7, a complete half bridge can be formed within the electric power package in this arrangement, as in other arrangements. For example, one half of twelve power components included in the electric power package 100 may be mounted in two parallel rows on (and electrically connected with) a first copper trace portion representing a DC+ 106 of the electric power package on the top side of a cooling structure of the electric power package. Bond wires of one half of the one half of the twelve power components, or a first quarter of the twelve power components, may be mounted on (and electrically connected with) a first portion 104-1 of an AC Out located at or near a first edge of the top side, whereas bond wires of the other half of the one half of the twelve power components, or a second quarter of the twelve power components, may be mounted on (and electrically connected with) a second portion 104-2 of the same AC Out located at or near a second edge (opposite to the first edge) of the top side.

As illustrated in the right portion of FIG. 7, bond wires from the other half of twelve power components included in the electric power package 100 may be mounted in two parallel rows on (and electrically connected with) a third copper trace portion representing a DC− 108 of the electric power package on the bottom side of the cooling structure of the electric power package. One half of the other half of the twelve power components, or a third quarter of the twelve power components, may be mounted on (and electrically connected with) a third portion 104-3 of the AC Out located at or near a third edge of the bottom side, whereas the other half of the other half of the twelve power components, or a fourth quarter of the twelve power components, may be mounted on (and electrically connected with) a fourth portion 104-4 of the AC Out located at or near a fourth edge (opposite to the third edge) of the bottom side.

During operation, electric currents flowing through the first quarter of the twelve power components are in a reversed or mirrored direction as compared with electric currents flowing through the second quarter of the twelve power components. Likewise, during operation, electric currents flowing through the third quarter of the twelve power components are in a reversed or mirrored direction as compared with electric currents flowing through the fourth quarter of the twelve power components. In addition, during operation, electric currents flowing through trace portions on two opposing (left and right) sides—other than the top and bottom sides on which the power components are mounted and other than the front and back sides on which cooling fluid inlets/outlets are located—are also in reversed or mirrored spatial directions.

3.0. Example Embodiments

According to one embodiment, a power module comprises: a three-dimensional (3D) cooling structure that has a plurality of planar sides; a first set of mountable power components that are mounted on a first planar side in the plurality of planar sides of the 3D cooling structure; a second set of mountable power components that are mounted on a second planar side in the plurality of planar sides of the 3D cooling structure. The second planar side represents an opposing side, of the 3D cooling structure, to the first planar side. The 3D cooling structure includes an interior space containing one or more cooling channels in which cooling fluid is to flow. The interior space of the 3D cooling structure is spatially surrounded by other planar sides in the plurality of planar sides in combination with the first and second planar sides.

In an embodiment, the first and second sets of mountable power components includes at least one mountable power component that is a bare die mounted by a pressure sintering process to a directed bonded copper layer located on exterior surfaces of the 3D cooling structure.

In an embodiment, the first set of mountable power components and the second set of mountable power components form a half bridge configuration.

In an embodiment, the first and second sets of mountable power components include at least one power semiconductor component with one or more bond wires electrically conductively connected to electrically conductive traces formed on the 3D cooling structure.

In an embodiment, the one or more cooling channels are at least partly enclosed by ceramic plates.

In an embodiment, the first and second sets of mountable power components spatially surround the one or more cooling channels in the cooling structure.

In an embodiment, spatially circumferential electric conductive traces on the cooling structure form electrically conductive loops that cancel magnetic fluxes generated from switched electric currents flowing into or from the first and second sets of mountable power components.

In an embodiment, electric traces on the cooling structure include electrically conductive terminal leads of specific spatial shapes for placing decoupling capacitors adjacent to entry terminals electrically connecting to an electric direct current power source.

In an embodiment, the decoupling capacitors are separate from direct current (DC) link capacitors.

In an embodiment, the DC link capacitors are external to the power module.

In an embodiment, the power module is deployed with one of: a vehicle system or a non-vehicle system.

In an embodiment, the power module is used to supply electric power to an AC load with one of variable AC voltages or fixed AC voltages.

In an embodiment, at least one cooling channel inlet is located on a third planar side, other than the first and second planar sides, in the plurality of planar sides of the cooling structure.

In an embodiment, the power module includes a first electric terminal lead to connect to a direct current positive (DC+) electrode of a direct current power source; the power module includes a second electric terminal lead to connect to a direct current negative (DC−) electrode of the direct current power source; the first electric terminal lead is electrically insulated from the second electric terminal lead in the power module.

In an embodiment, the power module includes a third electric terminal lead, which is used in part to output an electric alternative current (AC) voltage to an AC load; the first and second electric terminal leads are located adjacent to a third planar sided in the plurality of planar sides of the power module; the third electric terminal lead is located adjacent to a fourth planar side, different from the third planar side, in the plurality of planar sides of the power module.

In an embodiment, the first set of mountable power components is arranged along a single spatial row on the first planar side; the second set of mountable power components is arranged along a second single spatial row on the second planar side.

In an embodiment, the first set of mountable power components is partitioned into a first subset of mountable power components and a second subset of mountable power components; the first subset of mountable power components is arranged along a first spatial row on the first planar side; the second subset of mountable power components is arranged along a second spatial row, different from but parallel to the first spatial row, on the first planar side.

In an embodiment, the first set of mountable power components is arranged with equal distances between any two neighboring mountable power components, among the first set of mountable power components, along a specific spatial direction on the first planar side.

In an embodiment, the first set of mountable power components is partitioned into a plurality of subsets of mountable power components; the plurality of subsets of mountable power components are arranged with equal distances between any two neighboring subsets of mountable power components, among the plurality of subsets of mountable power components, along a specific spatial direction on the first planar side.

In an embodiment, the first set of mountable power components is arranged along a specific direction on the first planar side in between a first spatial edge of the first planar side and a second spatial edge of the first planar side; first electrically conductive traces between the first spatial edge and a first mountable power component nearest to the first spatial edge among the first set of mountable power components are minimized; second electrically conductive traces between the second spatial edge and a second mountable power component nearest to the second spatial edge among the first set of mountable power components are minimized.

Other examples of these and other embodiments are found throughout this disclosure. Note that, although separate embodiments are discussed herein, any combination of embodiments and/or partial embodiments discussed herein may be combined to form further embodiments.

4.0. Extensions and Alternatives

As used herein, the terms "first," "second," "certain," and "particular" are used as naming conventions to distinguish queries, plans, representations, steps, objects, devices, or other items from each other, so that these items may be referenced after they have been introduced. Unless otherwise specified herein, the use of these terms does not imply an ordering, timing, or any other characteristic of the referenced items.

In the drawings, the various components are depicted as being communicatively coupled to various other components by arrows. These arrows illustrate only certain examples of information flows between the components. Neither the direction of the arrows nor the lack of arrow lines between certain components should be interpreted as indicating the existence or absence of communication between the certain components themselves. Indeed, each component may feature a suitable communication interface by which the component may become communicatively coupled to other components as needed to accomplish any of the functions described herein.

In the foregoing specification, embodiments of the disclosure have been described with reference to numerous specific details that may vary from implementation to implementation. Thus, the sole and exclusive indicator of what is the disclosure, and is intended by the applicants to be the disclosure, is the set of claims that issue from this application, in the specific form in which such claims issue, including any subsequent correction. In this regard, although specific claim dependencies are set out in the claims of this application, it is to be noted that the features of the dependent claims of this application may be combined as appropriate with the features of other dependent claims and with the features of the independent claims of this application, and not merely according to the specific dependencies recited in the set of claims. Moreover, although separate embodiments are discussed herein, any combination of embodiments and/or partial embodiments discussed herein may be combined to form further embodiments.

Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A power module comprising:
    a cooling structure that has a plurality of planar sides;
    a first set of mountable power components that are mounted on a first planar side in the plurality of planar sides of the cooling structure;
    a second set of mountable power components that are mounted on a second planar side in the plurality of planar sides of the cooling structure;
    wherein the second planar side represents an opposing side, of the cooling structure, to the first planar side;
    wherein the cooling structure includes an interior space containing one or more cooling channels for receiving fluid; and
    wherein the interior space of the cooling structure is spatially surrounded by other planar sides in the plurality of planar sides in combination with the first and second planar sides;
    wherein the power module includes a first electric terminal lead to connect to a direct current positive (DC+) electrode of a direct current power source; wherein the power module includes a second electric terminal lead to connect to a direct current negative (DC−) electrode of the direct current power source; wherein the first electric terminal lead is electrically insulated from the second electric terminal lead in the power module.

2. The power module of claim 1, wherein the first and second sets of mountable power components includes at least one mountable power component that is a bare die mounted by a pressure sintering process to a directed direct bonded copper layer located on exterior surfaces of the cooling structure.

3. The power module of claim 1, wherein the first set of mountable power components and the second set of mountable power components form a half bridge configuration.

4. The power module of claim 1, wherein the first and second sets of mountable power components include at least one power semiconductor component with one or more bond wires electrically conductively connected to electrically conductive traces formed on the cooling structure.

5. The power module of claim 1, wherein the one or more cooling channels are formed by ceramic material.

6. The power module of claim 1, wherein the first and second sets of mountable power components spatially surround the one or more cooling channels in the cooling structure.

7. The power module of claim 1, further comprising spatially circumferential electric conductive traces, wherein the spatially circumferential electric conductive traces are disposed on the cooling structure to form electrically conductive loops for magnetic flux cancellation.

8. The power module of claim 1, further comprising electric traces and decoupling capacitors, wherein the electric traces are disposed on the cooling structure and have electrically conductive terminal leads of specific spatial shapes for decoupling capacitors adjacent to entry terminals electrically connecting to an electric direct current power source.

9. The power module of claim 8, wherein the decoupling capacitors are separate from direct current (DC) link capacitors.

10. The power module of claim 9, wherein the DC link capacitors are external to the power module.

11. The power module of claim 1, wherein all power components in the first and second sets of power components are of a common power component type.

12. The power module of claim 1, wherein the power module is used to supply electric power to an AC load with one of variable AC voltages or fixed AC voltages.

13. The power module of claim 1, wherein at least one cooling channel inlet is located on a third planar side, other than the first and second planar sides, in the plurality of planar sides of the cooling structure.

14. The power module of claim 1, wherein the power module includes a third electric terminal lead, which is used in part to output an electric alternative current (AC) voltage to an AC load; wherein the first and second electric terminal leads are located adjacent to a third planar sided in the plurality of planar sides of the power module; wherein the third electric terminal lead is located adjacent to a fourth planar side, different from the third planar side, in the plurality of planar sides of the power module.

15. The power module of claim 1, wherein the first set of mountable power components is arranged along a single spatial row on the first planar side; wherein the second set of mountable power components is arranged along a second single spatial row on the second planar side.

16. The power module of claim 1, wherein the first set of mountable power components is partitioned into a first subset of mountable power components and a second subset of mountable power components; wherein the first subset of mountable power components is arranged along a first spatial row on the first planar side; wherein the second subset of mountable power components is arranged along a second spatial row, different from but parallel to the first spatial row, on the first planar side.

17. The power module of claim 1, wherein the first set of mountable power components is arranged with equal distances between any two neighboring mountable power components, among the first set of surface mountable power components, along a specific spatial direction on the first planar side.

18. The power module of claim 1, wherein the first set of mountable power components is partitioned into a plurality of subsets of mountable power components; the plurality of subsets of mountable power components are arranged with equal distances between any two neighboring subsets of mountable power components, among the plurality of subsets of mountable power components, along a specific spatial direction on the first planar side.

19. The power module of claim 1, wherein the first set of mountable power components is arranged along a specific direction on the first planar side in between a first spatial edge of the first planar side and a second spatial edge of the first planar side; wherein first electrically conductive traces between the first spatial edge and a first mountable power component nearest to the first spatial edge among the first set of mountable power components are minimized; wherein second electrically conductive traces between the second spatial edge and a second mountable power component nearest to the second spatial edge among the first set of mountable power components are minimized.

* * * * *

UNITED STATES PATENT AND TRADEMARK OFFICE
CERTIFICATE OF CORRECTION

PATENT NO. : 12,289,872 B2  
APPLICATION NO. : 17/863953  
DATED : April 29, 2025  
INVENTOR(S) : Kusch et al.

Page 1 of 1

It is certified that error appears in the above-identified patent and that said Letters Patent is hereby corrected as shown below:

In the Claims

Column 18  
Claim 2: Line 10: Delete "directed"

Signed and Sealed this  
Twenty-seventh Day of May, 2025

Coke Morgan Stewart  
*Acting Director of the United States Patent and Trademark Office*